(12) United States Patent
Shishido et al.

(10) Patent No.: US 9,391,081 B1
(45) Date of Patent: Jul. 12, 2016

(54) METAL INDENTATION TO INCREASE INTER-METAL BREAKDOWN VOLTAGE

(71) Applicant: SanDisk Technologies Inc., Plano, TX (US)

(72) Inventors: Kiyokazu Shishido, Yokkaichi (JP); Takuya Futase, Yokkaichi (JP); Noritaka Fukuo, Yokkaichi (JP); Yuji Takahashi, Yokkaichi (JP); Shunsuke Watanabe, Yokkaichi (JP); Katsuo Yamada, Yokkaichi (JP); Masami Uozaki, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/848,087

(22) Filed: Sep. 8, 2015

(51) Int. Cl.
| | |
|---|---|
| *H01L 21/76* | (2006.01) |
| *H01L 27/112* | (2006.01) |
| *H01L 21/768* | (2006.01) |
| *H01L 23/528* | (2006.01) |
| *H01L 23/522* | (2006.01) |
| *H01L 23/535* | (2006.01) |
| *H01L 23/532* | (2006.01) |

(52) U.S. Cl.
CPC ...... *H01L 27/11293* (2013.01); *H01L 21/7684* (2013.01); *H01L 21/76816* (2013.01); *H01L 21/76819* (2013.01); *H01L 21/76877* (2013.01); *H01L 21/76895* (2013.01); *H01L 23/528* (2013.01); *H01L 23/5226* (2013.01); *H01L 23/535* (2013.01); *H01L 23/53228* (2013.01)

(58) Field of Classification Search
CPC .................. H01L 21/28273; H01L 21/02362; H01L 21/76; H01L 21/76224; H01L 21/76229; H01L 21/76837; H01L 21/76897; H01L 23/53295; H01L 29/0649
See application file for complete search history.

(56) References Cited

U.S. PATENT DOCUMENTS

| | | | |
|---|---|---|---|
| 7,737,015 | B2 | 6/2010 | Kohli et al. |
| 7,795,080 | B2 | 9/2010 | Orimoto et al. |
| 7,800,155 | B2 | 9/2010 | Matsuno |
| 7,863,190 | B1 | 1/2011 | Papasouliotis |
| 7,884,415 | B2 | 2/2011 | Nagano |
| 7,905,959 | B2 | 3/2011 | Tzu et al. |
| 8,053,347 | B2 | 11/2011 | Kang et al. |
| 8,129,264 | B2 | 3/2012 | Kim et al. |
| 8,362,542 | B2 | 1/2013 | Kang et al. |
| 8,383,497 | B2 | 2/2013 | Watanabe |
| 8,492,224 | B2 | 7/2013 | Purayath et al. |
| 8,546,239 | B2 | 10/2013 | Harari et al. |
| 8,603,890 | B2 | 12/2013 | Purayath et al. |
| 2006/0194390 | A1 | 8/2006 | Imai et al. |
| 2007/0184615 | A1 | 8/2007 | Brazzelli et al. |
| 2007/0257305 | A1 | 11/2007 | Sasago et al. |

(Continued)

FOREIGN PATENT DOCUMENTS

JP     2012-199381 A     10/2012

*Primary Examiner* — Roy Potter
*Assistant Examiner* — Paul Patton
(74) *Attorney, Agent, or Firm* — Davis Wright Tremaine LLP

(57) ABSTRACT

A first depression and a second depression are formed in an upper surface of a first metal layer. A dielectric layer is formed over the first metal layer. Subsequently, a wide trench is formed in the dielectric layer, the wide trench extending deeper in a first outer region and in a second outer region than in a central region located between the first outer region and the second outer region, the first outer region overlying the first depression and the second outer region overlying the second depression.

20 Claims, 11 Drawing Sheets

(56) References Cited

U.S. PATENT DOCUMENTS

| | | |
|---|---|---|
| 2008/0003743 A1 | 1/2008 | Lee |
| 2008/0283898 A1 | 11/2008 | Kuniya |
| 2009/0212352 A1 | 8/2009 | Aoyama et al. |
| 2009/0267131 A1 | 10/2009 | Nitta |
| 2010/0019311 A1 | 1/2010 | Sato et al. |
| 2010/0127320 A1 | 5/2010 | Nishihara et al. |
| 2010/0230741 A1 | 9/2010 | Choi et al. |
| 2011/0057250 A1 | 3/2011 | Higashi |
| 2011/0303967 A1 | 12/2011 | Harari et al. |
| 2011/0309430 A1 | 12/2011 | Purayath et al. |
| 2013/0309870 A1* | 11/2013 | Hong ............... H01L 21/02164 438/700 |

* cited by examiner

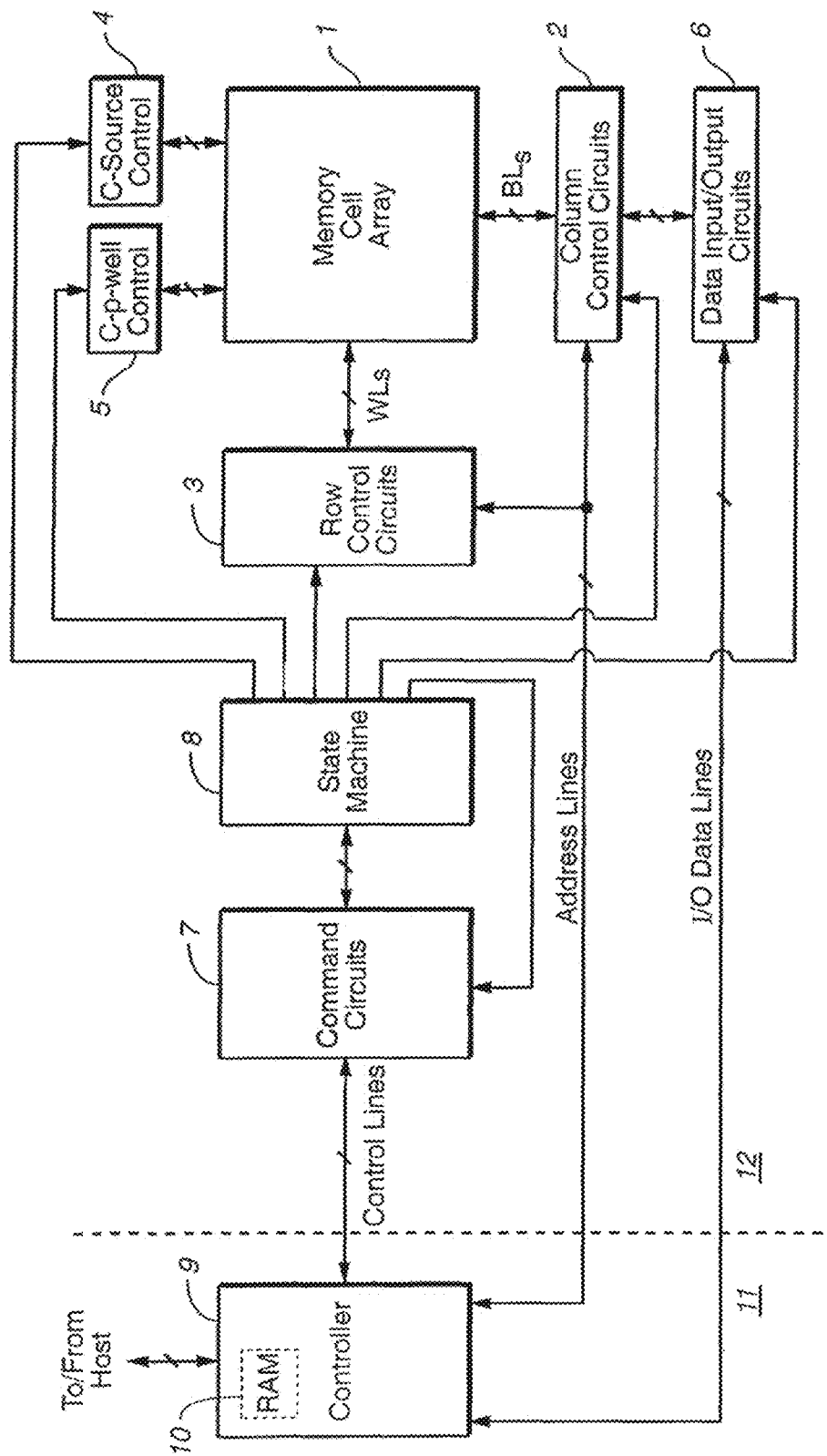
FIG._1
(Prior Art)

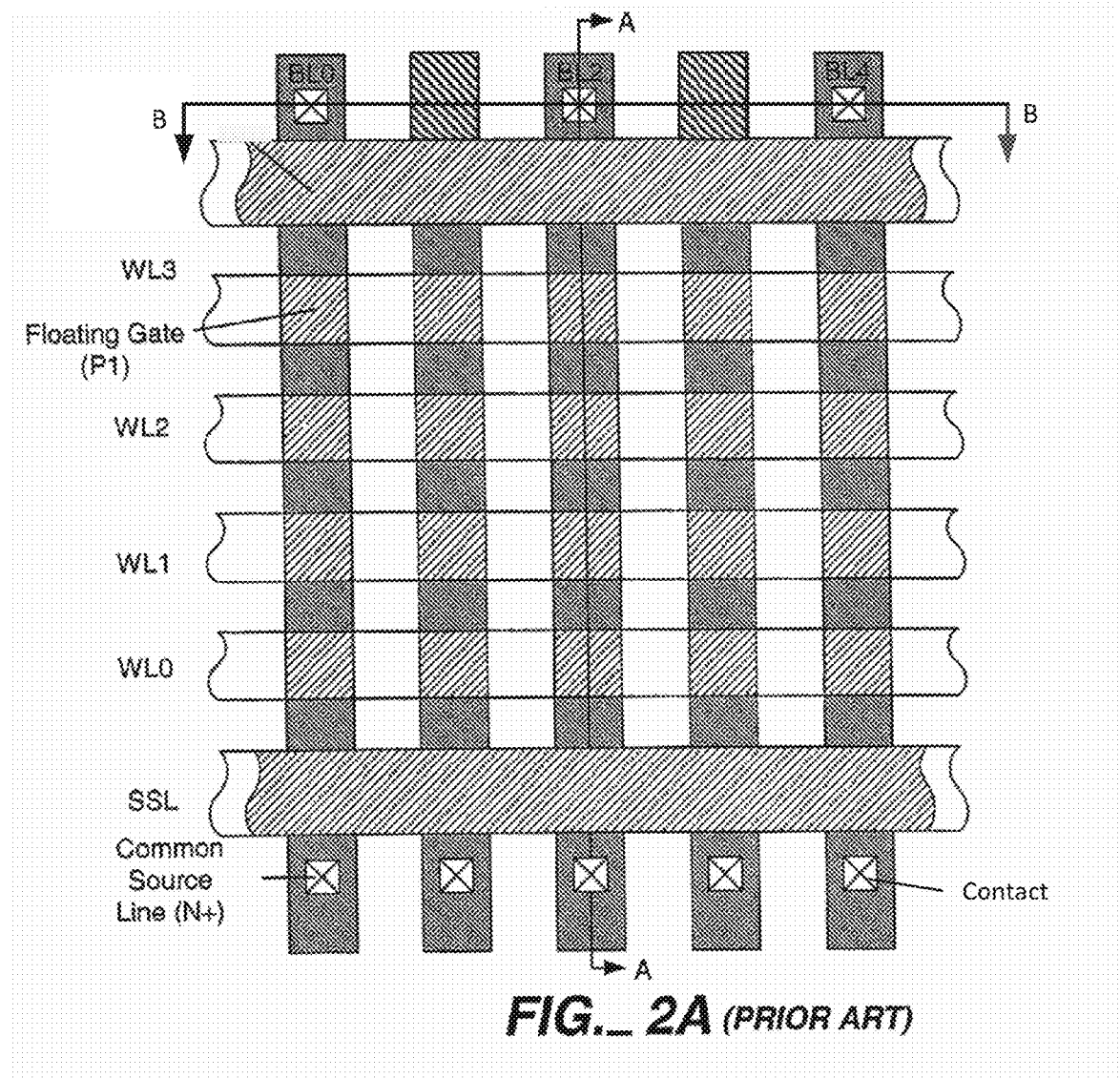
FIG._ 2A (PRIOR ART)

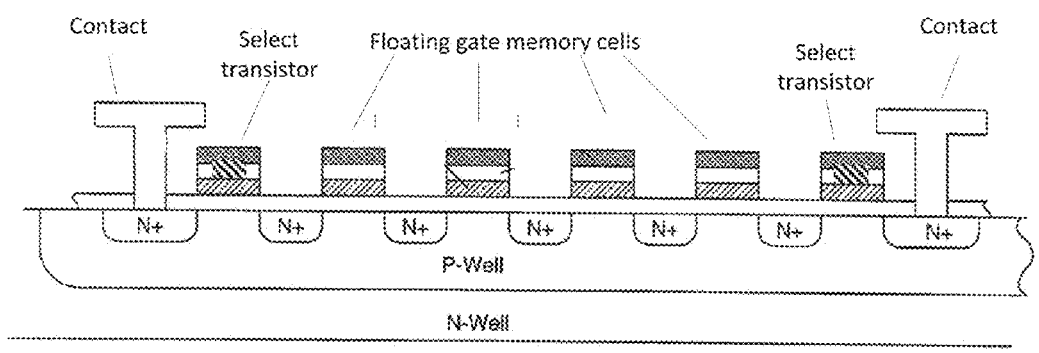
FIG. 2B *(PRIOR ART)*
*(Section A-A)*
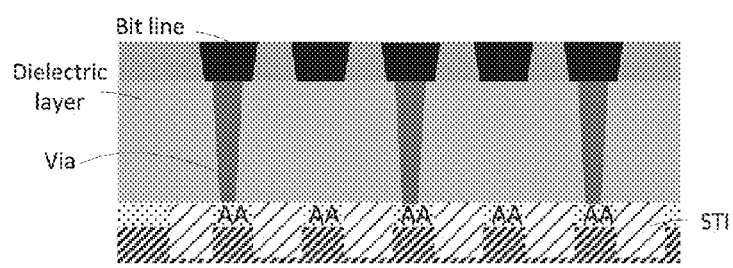
FIG. 2C (Prior Art)
*(Section B-B)*
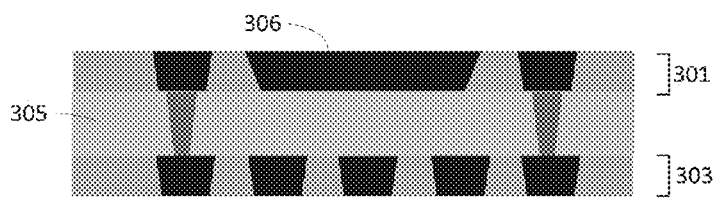
FIG. 3

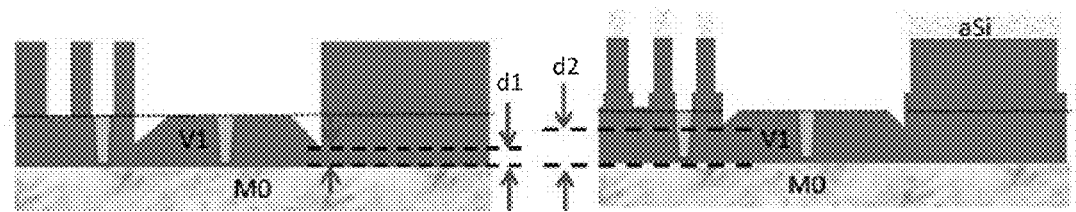
FIG. 14A  FIG. 14B
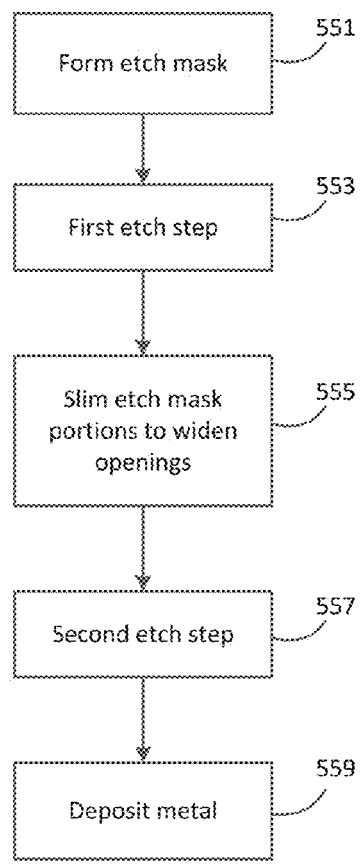
FIG. 15

METAL INDENTATION TO INCREASE INTER-METAL BREAKDOWN VOLTAGE

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom ends of the string connect to the bit line and a common source line respectively through select transistors (source select transistor and drain select transistor) in which the floating gate material (P1) is in direct contact with the control gate material (P2) through an opening formed in interpoly dielectric (IPD) material. The active gate thus formed is electrically driven from the periphery. Transistors in peripheral circuits are similarly formed by connecting floating gate material, P1, to overlying control gate material, P2, to form an active gate.

NAND strings are generally connected by conductive lines in order to form arrays that may contain many NAND strings. At either end of a NAND string a contact area may be formed. This allows connection of the NAND string as part of the array. Metal contact plugs (or "vias") may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Contacts to contact areas may be formed by etching contact holes through a dielectric layer and then filling the holes with metal to form contact plugs. Metal lines, such as bit lines, may be formed in a first metal layer that extends over the memory array. Electrical contact between metal lines and contact plugs occurs where horizontal metal lines intersect vertical contact plugs. An additional metal layer, or layers, (e.g. second metal layer, third metal layer, etc.) may extend over the first metal layer with isolation provided by an inter-metal dielectric layer. Connections may be formed by vias. Breakdown of inter-metal dielectric may cause coupling between layers, or even cause a short circuit, and is thus undesirable.

Thus, there is a need for structures and methods that allow formation of multiple layers of metal that are separated by inter-metal dielectric layers so that adequate isolation is provided between metal layers.

SUMMARY

In some integrated circuits, such as NAND flash memories, connections between different circuits in a substrate are formed in two or more layers of metal lines that extend over the substrate. Providing adequate separation between such metal layers ensures a high breakdown voltage and low coupling between layers. Where separation between metal layers is inadequate breakdown voltage may be reduced to an unacceptable level. Wide trenches etched in a dielectric layer tend to be deeper in outer regions than in central regions. When metal lines are formed in such trenches, separation between metal layers may be reduced under such outer regions and may result in low breakdown voltage.

Adequate separation under outer regions of wide lines may be provided by filling outer regions of wide trenches prior to deposition of metal. A filler layer may be deposited and etched back to fill outer regions to approximately the same level as central regions so that the bottom of a wide trench is made substantially flat. Deposition of the filler layer may use a process that does not deposit within narrow trenches but instead caps narrow trenches so that the filler layer is removed from over narrow trenches during etch back. The filler layer may remain along sidewalls of a wide trench between the dielectric and the metal line thereby narrowing the trench.

Adequate separation may be provided by reducing a difference in etch depth between a central region and outer regions by modifying etch mask openings at an intermediate stage of etching while depressions in outer regions are relatively shallow. Openings may be widened so that etch rates in such depressions are reduced (may be reduced to an etch rate that is similar to the central region). Etching resumes with more even etch rate which results in shallower depressions. This provides a stepped trench shape with wider upper portions and narrower lower portions.

Adequate separation may be provided by shaping an underlying metal layer to have depressions at locations where inadequate separation is likely, e.g. under outer regions of wide lines. Such depressions may have appropriate dimensions to ensure adequate physical separation between metal layers at all locations.

An example of a method of forming an integrated circuit includes: forming a first metal layer; subsequently forming a dielectric layer over the first metal layer; subsequently forming a wide trench having a width W1 and forming narrow trenches having a width W2 that is less than W1 in the dielectric layer, the wide trench extending deeper in outer regions than in a central region; subsequently performing a trench modification step that changes the width of the wide trench and reduces a depth difference between the outer regions and the central region of the wide trench; and subsequently depositing a second metal layer that fills the wide trench and the narrow trenches.

The trench modification step may include deposition of a filler layer in the wide trench and subsequent etching back of the filler layer thereby reducing the width of the wide trench to W3, where W3 is less than W1, and thereby partially filling outer regions of the wide trench with the filler layer. The deposition of the filler layer in the wide trench and the subsequent etching back of the filler layer may reduce the depth difference between the outer regions and the central region of the wide trench to about zero. The deposition of the filler layer may not deposit significant filler layer material in the narrow trenches. The filler layer may be formed of silicon oxide deposited by chemical vapor deposition using silane (SiH4). The etching back of the filler layer may remove substantially the entire filler layer from the central region of the wide trench and may remove substantially all of the filler layer from over the dielectric layer. The etching back may include an anisotropic etching step that exposes vias in the central region of the wide trench. The trench modification step may include slimming of etch mask portions and subsequent extending of the wide trench to have a width W4 in an upper portion, where W4 is greater than W1. The wide trench may be formed having a width W1 by applying a set of etch conditions and the wide trench may be extended by applying the set of etch conditions. The set of etch conditions may provide a first etch rate in the outer regions when forming the wide trench having a width W1 and subsequently may provide a second etch rate in the outer regions when extending the wide trench, the second etch rate being less than the first etch rate. When forming the wide trench having a width W1 and subsequently when extending the wide trench, the set of etch conditions may provide substantially the second etch rate in the central region. The set of etch conditions may produce etch byproducts at exposed regions of the dielectric layer, the etch byproducts distributed unevenly within the wide trench, which may inhibit subsequent etching unevenly within the wide trench. Excess second metal layer may subsequently be removed to form bit lines of a NAND flash memory in the narrow trenches and to form a wide conductive line in the wide trench.

An example of an integrated circuit includes: a first layer of metal conductive lines; a dielectric layer overlying the first layer of metal conductive lines, the dielectric layer having narrow trenches and a wide trench, the wide trench having stepped sidewalk and extending deeper in outer regions than in a central region; and a wide metal line formed in the wide trench.

Each of the narrow trenches may have stepped sidewalls. Each of the narrow trenches may contain a bit line of a NAND flash memory.

An example of an integrated circuit includes: a first layer of metal conductive lines; a dielectric layer overlying the first layer of metal conductive lines, the dielectric layer having narrow trenches and a wide trench; a wide metal line formed in the wide trench, the wide metal line lying in direct physical contact with the dielectric layer in a central region; and filler portions in outer regions of the wide trench located on either side of the central region, the filler portions extending under the wide metal line in the outer regions.

The filler portions may extend between sidewalls of the wide trench and sides of the wide metal line. The wide metal line may have substantially the same vertical distance from the first layer of metal conductive lines in the outer regions and in the central region. The integrated circuit may be a NAND flash memory and the narrow trenches contain bit lines.

An example of a method of forming an integrated circuit includes: forming a first metal layer; forming a first depression and a second depression in an upper surface of the first metal layer; subsequently forming a dielectric layer over the first metal layer; subsequently forming a wide trench in the dielectric layer, the wide trench extending deeper in a first outer region and in a second outer region than in a central region located between the first outer region and the second outer region, the first outer region overlying the first depression and the second outer region overlying the second depression; and subsequently depositing a second metal layer that fills the wide trench.

The method may also include: forming a plurality of contact holes through the dielectric layer to expose the first metal layer; subsequently, filling the plurality of holes with metal to form contact plugs; and subsequently, prior to forming the wide trench, planarizing the dielectric layer. Subsequent to forming the wide trench, a plurality of contact holes may be formed through the dielectric layer to expose the first metal layer; and the plurality of contact holes and the wide trench may subsequently be filled with the second metal layer. Narrow trenches may be formed in the dielectric layer while forming the wide trench in the dielectric layer, and the second metal layer may fill the narrow trenches. Excess metal may be removed to leave bit lines of a NAND flash memory in the narrow trenches and to leave a wide conductive line in the wide trench. Prior to forming the dielectric layer over the first metal layer, the first metal layer may be patterned into a plurality of first metal lines. The first depression and the second depression may be formed at locations where the wide conductive line is to extend over a first metal line that is not connected to the wide conductive line by a contact plug. A bottom surface of the wide conductive line in the first outer region may be located a vertical height above a bottom of the first depression in the upper surface of the first metal layer, and the bottom surface of the wide conductive line in the central region may be located an approximately equal vertical height above the upper surface of the first metal layer. Forming the first depression and the second depression may include anisotropic etching of the upper surface of the first metal layer. Forming the first depression and the second depression may include isotropic etching of the upper surface of the first metal layer.

An example of an integrated circuit includes: a first layer of metal conductive lines; a dielectric layer overlying the first layer of metal conductive lines, the dielectric layer having narrow trenches and a wide trench; a wide metal line formed in the wide trench, the wide metal line having a first outer region, a second outer region, and a central region between the first outer region and second outer region, the wide metal line extending deeper in the first and second outer regions than in the central region; and a first depression and a second depression in an upper surface of the first layer of metal conductive lines, the first depression underlying the first outer region and the second depression underlying the second outer region.

The first and second depressions may have a depth that is approximately equal to or greater than, a difference between wide metal line depth in the first and second outer regions and wide metal line depth in the central region. The difference may be in a range of about seven to ten nanometers (7 nm-10 nm), A plurality of contact plugs may extend through the dielectric layer. The plurality of contact plugs may have a height of about ninety nanometers (90 nm). The dielectric layer may be formed of silicon oxide and the wide metal line may be formed of copper.

An example of a method of forming a NAND flash memory includes: forming a first metal layer over an array of NAND flash memory cells; forming a first depression and a second depression in an upper surface of the first metal layer; patterning the first metal layer to form a plurality of first metal lines; subsequently forming a dielectric layer over the plurality of first metal lines; subsequently forming a plurality of contact holes through the dielectric layer to expose areas of the first metal layer; subsequently, filling the plurality of holes with metal to form contact plugs; subsequently forming a wide trench and a plurality of narrow trenches in the dielectric layer, the wide trench extending deeper in a first outer region and in a second outer region than in a central region located between the first outer region and the second outer region, the first outer region overlying the first depression and the second outer region overlying the second depression; subsequently depositing a second metal layer that fills the wide trench and the narrow trenches; and subsequently planarizing to leave a plurality of separate bit lines in the plurality of narrow trenches and leaving a wide metal line in the wide trench.

The first and second depressions may be formed by isotropic etching, or anisotropic etching, through an etch mask. The first and second depressions may be etched to a depth of about seven to ten nanometers (7 nm-10 nm). Subsequent to filling the plurality of holes with metal to form contact plugs, and prior to forming the wide trench and the plurality of narrow trenches in the dielectric layer, an upper surface of the dielectric layer may be planarized.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.

FIG. 2A is a plan view of a prior art NAND array.

FIG. 2B shows a cross section of the NAND array of FIG. 2A.

FIG. 2C shows another cross section of the NAND array of FIG. 2A.

FIG. 3 illustrates metal layers separated by inter-metal dielectric in cross section.

FIGS. 14A-B illustrate wide trenches formed in a single step, and in two steps with widening of etch mask openings between steps, respectively.

FIG. 15 shows an example of process steps used to form metal layers with adequate separation.

DETAILED DESCRIPTION OF EXEMPLARY EMBODIMENTS

Memory System

Figure 4:
FIG. 4 illustrates a wide trench etched in an inter-metal dielectric layer.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use non-volatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contact plugs, or vias, are formed at either end to connect the NAND strings in the memory array to conductive lines (e.g. connecting to bit lines at one end and to a common source line at the other end). Such a contact plug may be formed of metal that is deposited into a contact hole that is formed in a dielectric layer. FIG. 2C shows a cross section along B-B of FIG. 2A. This view shows metal contact plugs extending down through contact holes in a dielectric layer to make contact with active areas ("AA") in the substrate (i.e. with N+ areas of FIG. 2B). STI regions are located between active areas of different strings to electrically isolate an individual NAND string from its neighbors. Bit lines extend over the memory array in a direction perpendicular to the cross section shown. Alternating bit lines are connected to vias in the cross section shown. (It will be understood that other vias, that are not visible in the cross section shown, connect the remaining bit lines to other active areas). In this arrangement, locations of vias alternate so that there is more space between vias and thus less risk of contact between vias. Other arrangements are also possible.

The bit lines shown in FIG. 2C are formed in a first metal layer (e.g. copper layer) that is separated from the substrate by a dielectric layer. One or more additional metal layers may be formed over such a first metal layer to allow connection of various components within a memory array and connection to peripheral circuits. An example of a second metal layer 301 over a first metal layer 303 separated by an inter-metal dielectric layer 305 is shown in FIG. 3. Both layers are patterned into conductive lines (e.g. bit lines and other lines) in this example. While bit lines are relatively narrow, other lines may be relatively wide (significantly wider than a bit line) as shown by wide line 306 in FIG. 3. Formation of such wide lines presents certain problems.

Wide Trenches

As memories become smaller, the spacing between lines tends to diminish both laterally and vertically. Accordingly, coupling between lines tends to increase as technology progresses to ever-smaller dimensions. An inter-metal dielectric layer is generally designed to be thick enough so that breakdown is unlikely to occur when conductive lines above and below are biased within their normal ranges. However, if the distance between metal layers is reduced the risk of such breakdown, or some coupling, or other undesirable effects is increased. While the following examples refer to an inter-metal dielectric layer between first and second metal layers over an a memory array, techniques described here are applicable to inter-metal dielectric between any two metal layers (e.g. between a second metal layer and a third metal layer) and over any area of an IC (not just over a memory array) and is not limited to a specific location or to any specific metal layers.

FIG. 4 illustrates an example of a problem that may occur when forming metal lines. Metal lines are formed by filling wide trench T1 and narrow trenches T2 with metal (e.g. copper, with one or more barrier layers as appropriate) in what may be referred to as a damascene process. Trenches T1, T2, are formed by etching a dielectric layer 407 using an etch mask to define trenches. When a wide trench T1 (e.g. width W1 as shown) is etched, the trench tends to have an uneven lower surface. Thus trench extends deeper (closer to underlying metal layer M0) in outer regions than in a central region and depressions are formed in the trench floor in outer regions. This reduces the distance between the underlying metal layer, M0, and metal that is subsequently deposited in wide trench T1. This can cause a reduction in breakdown voltage so that breakdown of the inter-metal dielectric layer becomes more likely. Etching generally proceeds until contact plugs (vias) are exposed for contact. Contact plugs are generally in a central region. When contact plugs are exposed by etching wide trenches may be significantly closer to an underlying metal layer in outer regions than in central regions. Such unevenness generally does not occur in narrower trenches (e.g. width W2) as shown because the closer proximity of the center and edges of such a trench results in closer process conditions and etch rates.

Figure 5:
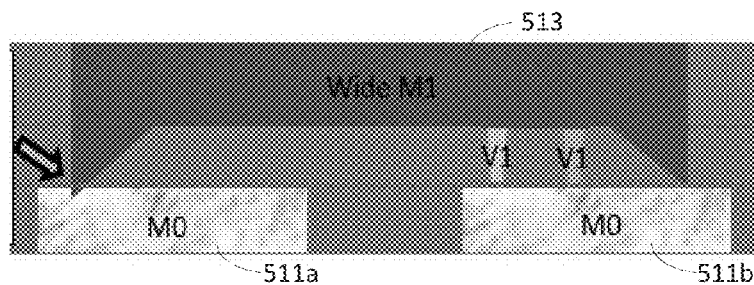
FIG. 5 illustrates unwanted contact between metal layers.

While the view of FIG. 4 shows an underlying metal layer, M0, as continuous, it will be understood that metal layers are generally patterned into conductive lines as previously discussed. FIG. 5 shows an example of two metal conductive lines 511a-b in an underlying metal layer, M0, and a wide metal line 513 formed in an overlying metal layer. In this example, outer regions (edge regions) of the wide trench in which the wide metal line is formed extend down to the underlying metal layer, M0, so that electrical contact is made between wide metal line 513 and conductive lines 511a-b. Contact between wide metal line 513 and conductive line 511b may not cause problems because these components are connected by contact plugs V1 (i.e. they are designed to be electrically connected). However, electrical contact between wide metal line 513 and conductive line 511a (indicated by arrow) is not by design. This shorts wide select line 513 and conductive lines 511a-b together, which may cause the memory, or a portion of the memory, to be inoperable. In other cases, an overlying metal may not extend to make contact with an underlying metal but may still cause at least some portion of an integrated circuit to be inoperable, e.g. by lowering breakdown voltage or producing coupling between lines in different layers.

Figure 6:
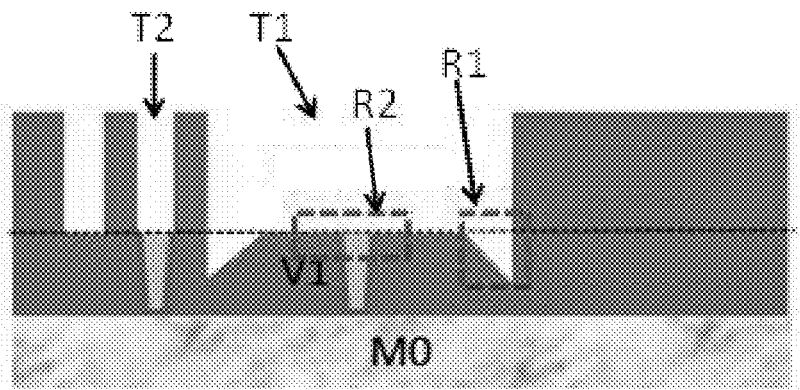
FIG. 6 illustrates a wide trench that is deeper in outer regions than a central region.

FIG. 6 illustrates a cross section of a wide trench T1 that extends deeper in outer regions (e.g. R1) than in a central region (R2) without making contact with underlying metal layer M0. Depressions are formed in outer regions such as region R1 but not in central region R2. In contrast, narrow trenches such as trench T2 are narrow enough that there is no significant difference in etch rates between outer regions and central regions (narrow enough that entire trench is close to an edge). Etching at this stage has exposed vias. If metal is deposited at this point then a reduced breakdown voltage may result where depressions in outer regions such as R1 are filled with metal that extends too close to underlying metal layer M0.

Filler Layer

Figure 7:
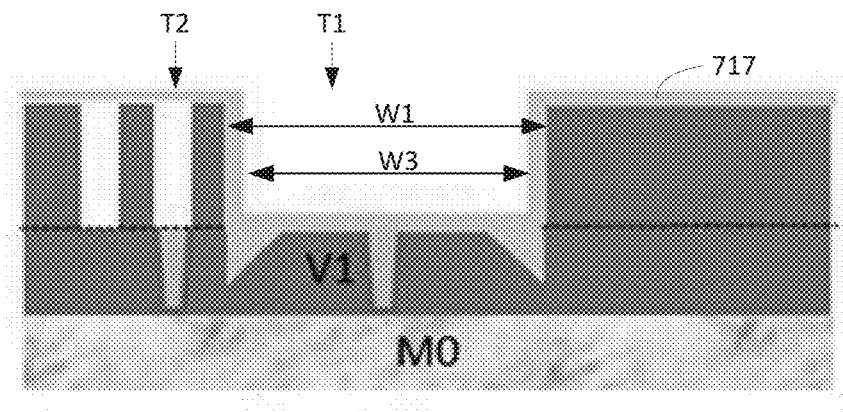
FIG. 7 illustrates deposition of a filler layer.

FIG. 7 illustrates deposition of a filler layer 717 in the wide trench T1 of FIG. 6. Filler layer 717 is sufficiently thick to fill depressions in outer regions (e.g. region R1). Filler layer 717 deposits along sidewalls of wide trench T1 and thus reduces the width of wide trench T1 from W1 to W3. Filler layer is formed so that little or no deposition occurs in narrow trenches T2 (width W2). Instead, filler layer is deposited over narrow trenches T2. Such layers are commonly used as capping layers for air gap structures. Examples of suitable filler layers include silicon oxide layers formed using silane (SiH4) in a chemical vapor deposition process. Specific process parameters may be tuned to ensure adequate filling of trenches having a width W1 without significant deposition in trenches having a width W2 based on the values of W1 and W2.

Figure 8:
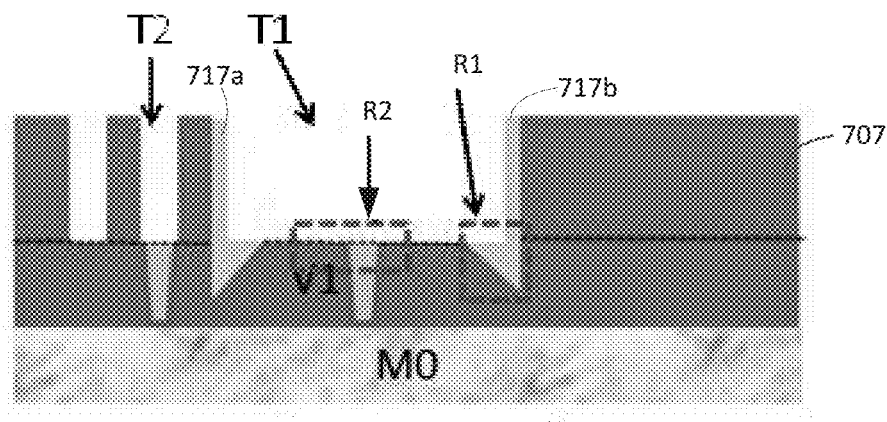
FIG. 8 illustrates etching back of the filler layer to leave filler portions.

FIG. 8 shows removal of excess material of filler layer 717 (e.g. by anisotropic etching back filler layer 717) so that filler layer 717 is removed from over narrow trenches T2 and over dielectric layer 707. Filler layer 717 is also removed from central region R2 of wide trench T1 so that vias are exposed in this area. Thus, vias are exposed in both wide trenches and narrow trenches at this stage. Depressions in outer regions (R1) are filled with filler portions 717a-b so that the bottom of trench T1 is about level (i.e. the outer regions are filled to be flush with the central region R2 and thus form a substantially even trench floor). In other examples, there may be some difference in depth but these differences are significantly reduced by filler portions, i.e. the depth difference between the outer regions and the central region R2 is less in FIG. 8 than in FIG. 6. Filler portions 717a-b extend along sidewalls of wide trench T1 thereby narrowing wide trench from W1 to W3.

Because the floor of wide trench T1 is leveled by filler portions 717a-b, metal deposited in trench T1 does not extend closer to underlying metal layer, M0, in outer region R3 than in central region (R4). The level trench floor results in a metal line that maintains substantially the same height above underlying metal layer, M0, at all locations, i.e. the same height in R1 and R2. Dielectric layer 707 is exposed in central region R2 so that metal lies in direct contact with dielectric layer 707 in this region. In outer region R1, filler portion 717b underlies the deposited metal and thus maintains an adequate separation from metal layer M0.

Figure 9:
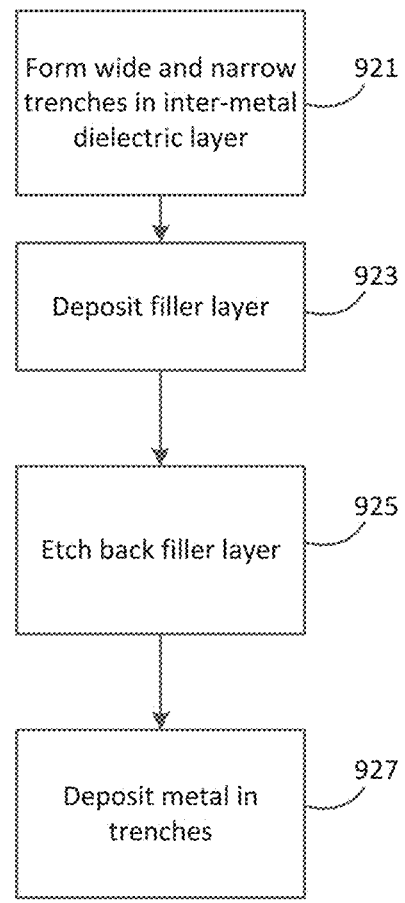
FIG. 9 shows an example of steps that may be used in forming metal layers.

FIG. 9 illustrates process steps in an example of a process for forming wide metal lines. Wide and narrow trenches are formed 921 in an inter-metal dielectric layer. Subsequently, a filler layer is deposited 923 using process conditions that ensure that the filler layer caps narrow trenches without significant deposition within narrow trenches and fills depressions in outer regions of wide trenches. The filler layer also deposits along sidewalls of wide trenches thereby reducing the width of wide trenches. Subsequently, the filler layer is etched back 925 to expose vias (and expose inter-metal dielectric) in central regions of wide trenches while leaving filler portions in depressions and along sidewalls of wide trenches. The filler layer is also removed from over narrow trenches. Subsequently, metal is deposited 927 to fill wide and narrow trenches and planarized (e.g. by chemical mechanical polishing, CMP) to separate metal lines.

Etch Rate

Figure 10:
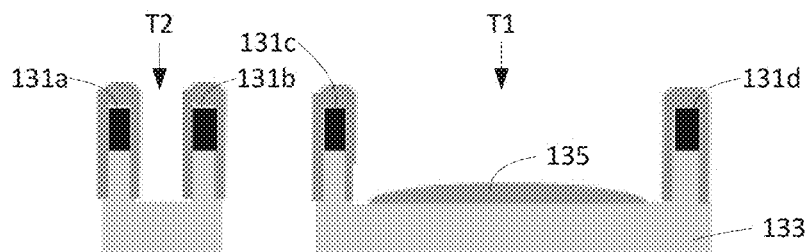
FIG. 10 illustrates an example of how wide trenches may be etched unevenly.

FIG. 10 illustrates an example of a mechanism by which outer regions (outer regions) of a wide trench T1 may be etched deeper than a central region. During etching, byproducts are formed from etch reactions. While such etch byproducts may be removed from an etch chamber with exhaust gasses, some etch products may be deposited on exposed surfaces and may inhibit further etching. Byproducts may not be distributed evenly. For example, at locations where hard mask portions 131a-d overlie the surface of the dielectric layer 133, no etching occurs and no byproducts are produced. Thus, along edges of wide trench T1, where byproducts are produced on only one side (towards the center of the trench), the deposition rate of such byproducts may be lower than in the middle of wide trench T1, where byproducts are produced on both sides. In the example of FIG. 10, the deposition rate of byproducts in outer regions of the trench is less than the removal rate so that no byproduct layer is formed and there is no inhibition of further etching. In the center of the trench, the byproduct deposition rate is higher and a layer of byproduct 135 forms that inhibits etching (i.e. reduces etch rate at this location). While some equilibrium may be reached between deposition rate and removal rate at this location, this may occur after deposition rate is lowered by the presence of a significant layer of byproduct. Thus, the etch rate may be uneven which may produce an uneven trench floor. For example, the distribution of byproduct illustrated in FIG. 10 may reduce an etch rate in a central region compared with outer regions. This may cause deeper etching in outer regions than in a central region.

Figure 11:
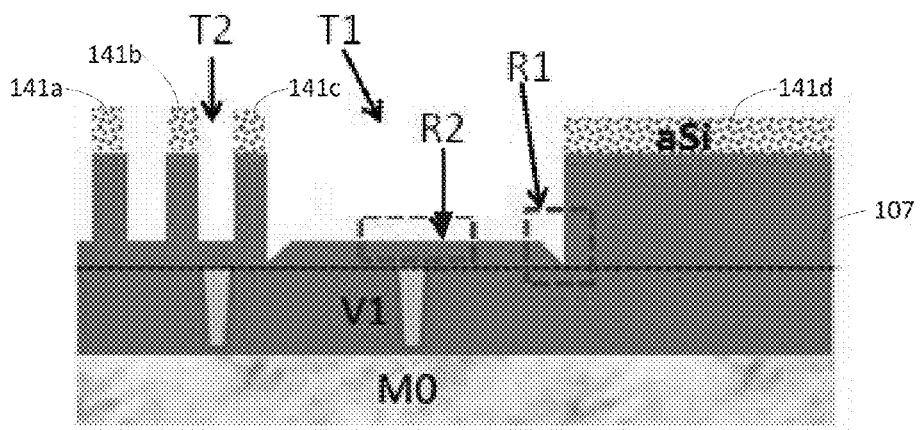
FIG. 11 shows trenches at an intermediate stage.

FIG. 11 illustrates an example of a wide trench T1 etched in a dielectric layer 107. A pattern of etch mask portions 141a-d define the wide trench having a width W1 (and narrow trenches having widths W2). The etch mask portions 141a-d are formed of amorphous silicon (aSi) in this example. The cross section of FIG. 11 shows an intermediate stage in etching. For example, the depth of wide trench T1 may be approximately half its final depth at this point, or may be some other fraction of final depth (e.g. ¼, ⅓, ⅔, etc.). Significant etching remains to be performed at this point so that vias remain covered by a significant thickness of dielectric (the level of the top of contact plugs is shown by dotted line). It can be seen that wide trench T1 extends deeper in outer regions such as R1 than in central region R2. However, because this is an intermediate stage in the etch process, the depth difference between the outer regions and central region is less than it would be if etching continued to extend the trench to its final depth (i.e. the depth difference increases as etching proceeds, so the depth difference at an intermediate stage is generally less than the final depth difference). In this example, instead of continuing the etch all the way to its final depth with the etch mask as shown, the etch mask is modified in order to reduce the difference in etch rates between the center and outer regions (R2 and R1) and to thereby reduce the depth difference when the trench reaches its final depth.

Figure 12:
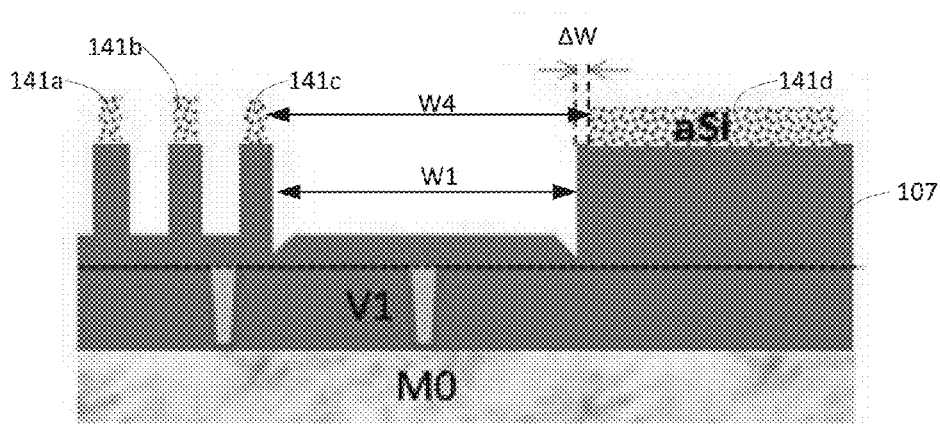
FIG. 12 shows widening of openings in the etch mask of FIG. 11.

FIG. 12 illustrates an example of how etch rate differences may be reduced by modifying an etch mask. FIG. 12 shows a slimming step that slims (reduces lateral dimensions) of etch mask portions 141a-d. An appropriate isotropic etch may be selected for this slimming step so that dielectric layer 107 remains substantially unaffected (e.g. slimming may use an etch chemistry that is selective to amorphous silicon and does not substantially etch silicon oxide). Etch mask portions 141a-d are slimmed by $\Delta W$ in this example. Thus, the width of an opening between etch mask portions that define wide trench is increased by $2\Delta W$ in this example, from W1 to W4. Subsequently, etching of trenches resumes with openings in the etch mask widened to W4, thereby exposing new areas of dielectric. Etching may resume with the same etch conditions (e.g. same gasses, pressure, temperature, RF power, etc.) as before, or may use different etch conditions, to extend trenches to their final depth.

Figure 13:
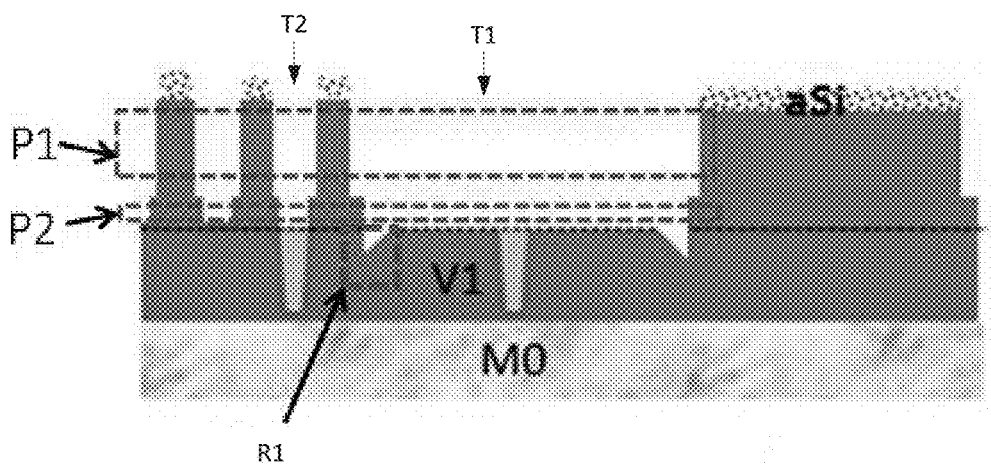
FIG. 13 illustrates extending of trenches through widened openings of FIG. 12.

FIG. 13 illustrates the structure of FIG. 12 after further etching to extend trenches to their final depths (thereby exposing vias). It can be seen that trenches have stepped sidewalls with steps corresponding to widening of openings in the etch mask. Thus, trenches have upper portions (indicated by P1) that are wider (by $2*\Delta W$) than lower portions (indicated by P2). One result of widening trenches at an intermediate stage in this way is to change local conditions in outer regions such as R1. In particular, the etch rate in outer region R1 may be made substantially similar to the etch rate in a central region by widening. Exposing additional dielectric may result in byproduct being formed on either side of outer region R1 so that the etch rate in outer region R1 may be similar to the etch rate elsewhere in the wide trench (e.g. similar to central region R2). Thus, during the second trench etching step, etching may proceed at substantially the same rate in outer region R1 and in central region R2. Thus, the difference in trench depth may be substantially frozen so that it remains the same during the second step.

FIGS. 14A-B illustrate cross sections of trenches formed by a single etch step that uses the same etch mask throughout (FIG. 14A) and trenches formed by two etch steps, with widening of etch mask openings (slimming of etch mask portions) between the etch steps (FIG. 14B). It can be seen that the minimum distance between these trenches and underlying metal layer M0 is increased from d1 in FIG. 14A to d2 in FIG. 14B because etch rates are substantially equal between the outer regions and the central region in the second step. The breakdown voltages may be increased accordingly, e.g. if d2 is 2*d1 then breakdown voltage is doubled.

While the process above stops etching once to perform etch mask slimming, this may be repeated two or more times during etching. In this case, multiple steps are formed along sides of trenches (both wide and narrow trenches).

FIG. 15 illustrates an example of steps used to form metal lines with increased distance between metal layers. An etch mask is formed 551 over an inter-metal dielectric layer that extends over an underlying metal layer. A first anisotropic etch step 553 (e.g. RIE) forms trenches, including wide and narrow trenches, into the inter-metal dielectric layer. Wide trenches tend to extend deeper in outer regions than in a central region. The first etch step terminates with a substantial amount of dielectric remaining to be etched (contact plugs are still covered). The etch mask is then subjected to slimming 555 (e.g. by isotropic etching) so that openings in the etch mask are widened. A second etch step 557 then extends trenches by anisotropic etching through the widened openings. The second etch step tends to have substantially equal etch rates in outer and central regions so that a difference in etch depth from the first step does not generally increase in the second step. Subsequently, metal is deposited 559 in the trenches and excess metal is removed to leave separate conductive lines.

Depressions in Underlying Metal Layer

While the above examples are directed to a metal layer that overlies an inter-metal dielectric layer, in some cases, an increased distance between metal layers on either side of an inter-metal dielectric layer may be achieved by forming depressions, or recesses, in the lower metal layer at locations where the distance between metal layers is likely to be less than a desired distance. For example, as discussed above, the distance between metal layers is likely to be less than desired under outer regions of wide conductive lines. Accordingly, an underlying metal layer can be shaped to reflect the expected protrusions of metal in an overlying metal layer.

Figure 16:
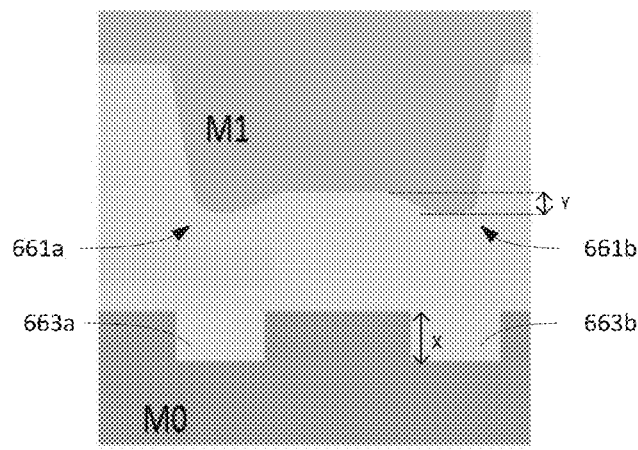
FIG. 16 shows depressions in a first metal layer at locations under protrusions in a second metal layer.

FIG. 16 shows an example of a wide metal line in an overlying (M1) metal layer that has protrusions 611a-b in outer regions because of deeper etching in these regions. Depressions 663a-b are located on an upper surface of an underlying metal (M0) layer at locations directly underneath protrusions 661a-b. Depressions 663a-b have a depth X that is equal or greater than the depth Y of the protrusions. Thus, for example, where a wide trench has a depth difference between center and outer regions of about seven to ten nanometers (7-10 nm), protrusions extend down about seven to ten nanometers in outer regions, and depressions may be formed in an underlying metal layer that are about seven to ten nanometers deep so that separation under outer regions of the wide line is about the same as under the central region (contact plug height), for example the vertical height of the wide metal line above M0 metal may be ninety nanometers in both the central and outer regions where contact plug height is ninety nanometers (90 nm). In general, the locations and dimensions of such depressions may be chosen to maintain some minimum separation between upper metal layer, including protrusions, and lower metal layer.

The structure of FIG. 16 may be formed by any suitable process. An example of steps that may be used to form such a structure is shown in FIGS. 17A-F.

Figure 17A:
FIGS. 17A-F show an example of formation of metal layers with depressions in a first metal layer at locations under protrusions in a second metal layer of FIG. 16.

FIG. 17A shows a first metal layer M0 that is patterned and etched to form depressions 771a-b at desired locations. In this example, the locations correspond to outer regions of a subsequently formed wide metal line in an overlying metal layer. The dimensions of depressions may be selected according to expected locations and dimensions of protrusions. Patterning may be direct photolithographic patterning or may use sidewall spacers in sidewall assisted patterning (SAP).

Figure 17B:
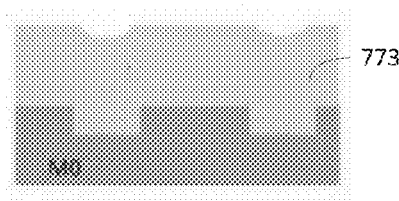

FIG. 17B shows the structure of FIG. 17A after deposition of an inter-metal dielectric layer 773. Inter-metal dielectric layer 773 fills depressions 771a-b and overlies first metal layer M0. An upper surface of inter-metal dielectric layer may have depressions at locations directly overlying depressions in first metal layer, though these depressions are generally smaller (shallower) and may not be significant.

Figure 17C:
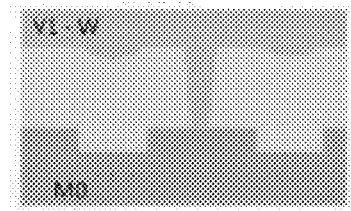

FIG. 17C shows the structure of FIG. 17B after patterning to form contact holes and subsequent deposition of via metal V1 (e.g. tungsten, W) to fill the contact hole and thus form a contact plug, or via.

Figure 17D:
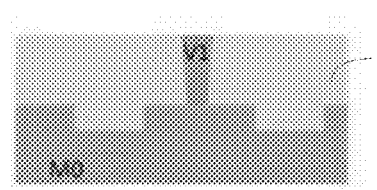

FIG. 17D shows subsequent etching back of via metal V1 to leave metal in the contact hole while removing excess metal that overlies inter-metal dielectric layer 773. For example, chemical mechanical polishing (CMP) may remove metal down to a level that ensures that all metal overlying inter-metal dielectric layer (including metal in any depression in upper surface of inter-metal dielectric layer) is removed.

Figure 17E:
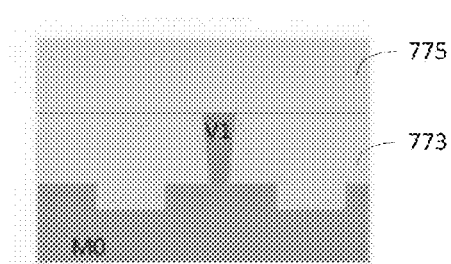

FIG. 17E illustrates the structure of FIG. 17D after deposition of a blanket layer of dielectric 775, which may be the same dielectric as inter-metal dielectric layer (e.g. silicon oxide).

Figure 17F:
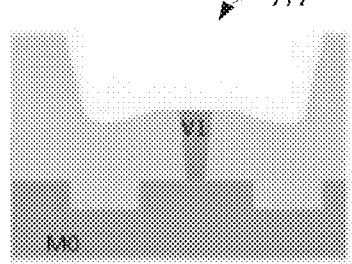

FIG. 17F illustrates the structure of FIG. 17E after patterning and etching to form a wide trench T1 777. Narrow trenches (not shown) may also be formed in this step. It will be understood that depressions and via V1 are shown to illustrate when and how such structures are formed and that such structures are formed at various locations. In particular, depressions may be formed where isolation between metal layers is desired (where no via connects metal layers).

Figure 18A:
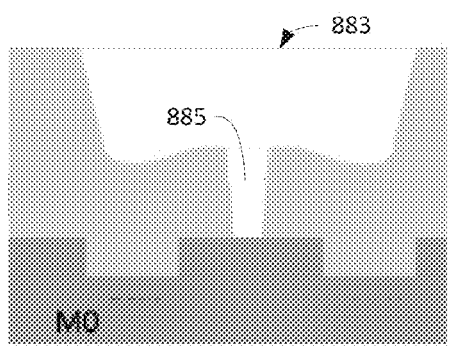
FIGS. 18A-B show an example of an alternative order of forming contact plugs and metal lines.
Figure 18B:
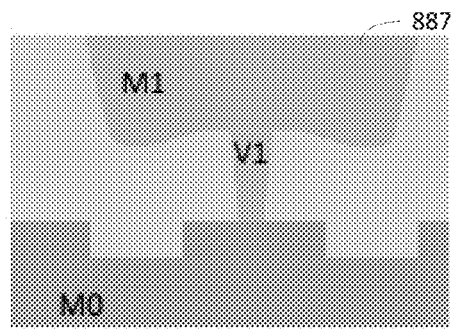

FIGS. 18A-B illustrate an alternative process for forming a second metal layer and vias between metal layers. FIG. 18A illustrates a dielectric layer 881 that is patterned to form a wide trench 883 and to form a contact hole 885 extending down from wide trench 883 to expose the first metal layer M0. Two different patterning and etching processes may be performed to form trenches 883 and contact hole 885 in what may be referred to as a dual damascene process. Subsequently, metal M1 may be deposited as shown in FIG. 18B to thereby form via V1 and conductive line 887. Thus, rather than form vias first in an inter-metal dielectric layer, and then form metal lines in an overlying dielectric layer, both structures are formed together in this example.

Figure 19:
FIG. 19 shows an example of rounded depressions.

While depressions are shown as having a substantially rectangular shape in the above examples, it will be understood that depressions may be formed with any suitable shape. While anisotropic etching, such as RIE, may provide a substantially rectangular etch profile, isotropic etching, such as wet etching, may provide a rounded etch profile. FIG. 19 shows an example of depressions 991a-b that are formed in a lower metal layer M0 by isotropic etching (e.g. wet etching) to have a rounded profile.

Figure 20:
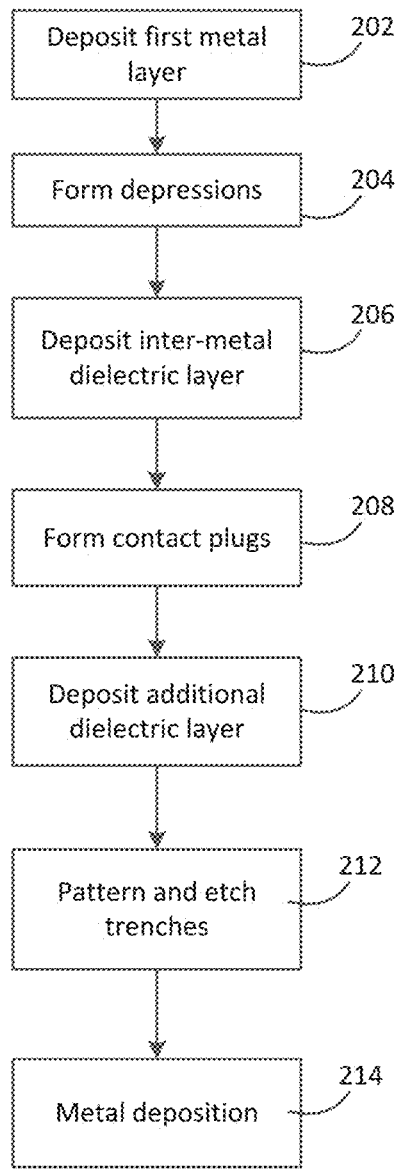
FIG. 20 shows an example of steps used to form metal layers separated by inter-metal dielectric.

FIG. 20 illustrates steps in an example process for foiling metal layers separated by an inter-metal dielectric layer. A first metal layer is deposited 202 over a substrate (e.g. over a NAND flash memory array, with some insulator separating the first metal layer from underlying devices). Depressions are formed 204 in the first metal layer (either before or after the layer is patterned into separate conductive lines) at locations where protrusions are expected in a subsequent metal layer. An inter-metal dielectric layer is deposited 206 and contact plugs are then formed that extend through the inter-metal dielectric layer to the first metal layer. An additional dielectric layer is deposited 210 over the inter-metal dielectric layer and contact plugs. Subsequently, patterning and etching 212 form trenches and expose vias (alternatively, double patterning may form contact holes at this time). Then, metal deposition 214 fills trenches to form conductive lines.

In some cases, two or more of the techniques described above may be used together. For example, depressions in an underlying metal layer may be combined with one of the techniques directed to the trench in which a wide line is formed.

CONCLUSION

Although the various aspects have been described with respect to examples, it will be understood that protection within the full scope of the appended claims is appropriate.

It is claimed:

1. A method of forming an integrated circuit comprising:
forming a first metal layer;
forming a first depression and a second depression in an upper surface of the first metal layer;
subsequently forming a dielectric layer over the first metal layer;
subsequently forming a wide trench in the dielectric layer, the wide trench extending deeper in a first outer region and in a second outer region than in a central region located between the first outer region and the second outer region, the first outer region overlying the first depression and the second outer region overlying the second depression; and
subsequently depositing a second metal layer that fills the wide trench.

2. The method of claim 1 further comprising:
forming a plurality of contact holes through the dielectric layer to expose the first metal layer;
subsequently, filling the plurality of holes with metal to form contact plugs; and
subsequently, prior to forming the wide trench, planarizing the dielectric layer.

3. The method of claim 1 further comprising:
subsequent to forming the wide trench, forming a plurality of contact holes through the dielectric layer to expose the first metal layer; and
subsequently filling the plurality of contact holes and the wide trench with the second metal layer.

4. The method of claim 1 further comprising forming narrow trenches in the dielectric layer while forming the wide trench in the dielectric layer, and wherein depositing the second metal layer fills the narrow trenches.

5. The method of claim 4 further comprising removing excess metal to leave bit lines of a NAND flash memory in the narrow trenches and to leave a wide conductive line in the wide trench.

6. The method of claim 5 further comprising, prior to forming the dielectric layer over the first metal layer, patterning the first metal layer into a plurality of first metal lines.

7. The method of claim 6 wherein the first depression and the second depression are formed at locations where the wide conductive line is to extend over a first metal line that is not connected to the wide conductive line by a contact plug.

8. The method of claim 7 wherein a bottom surface of the wide conductive line in the first outer region is located a vertical height above a bottom of the first depression in the upper surface of the first metal layer, and the bottom surface of the wide conductive line in the central region is located an approximately equal vertical height above the upper surface of the first metal layer.

9. The method of claim 1 wherein forming the first depression and the second depression includes anisotropic etching of the upper surface of the first metal layer.

10. The method of claim 1 wherein forming the first depression and the second depression includes isotropic etching of the upper surface of the first metal layer.

11. An integrated circuit comprising:
a first layer of metal conductive lines;
a dielectric layer overlying the first layer of metal conductive lines, the dielectric layer having narrow trenches and a wide trench;
a wide metal line formed in the wide trench, the wide metal line having a first outer region, a second outer region, and a central region between the first outer region and second outer region, the wide metal line extending deeper in the first and second outer regions than in the central region; and
a first depression and a second depression in an upper surface of the first layer of metal conductive lines, the first depression underlying the first outer region and the second depression underlying the second outer region.

12. The integrated circuit of claim 11 wherein the first and second depressions have a depth that is approximately equal to, or greater than, a difference between wide metal line depth in the first and second outer regions and wide metal line depth in the central region.

13. The integrated circuit of claim 12 wherein the difference is in a range of about seven to ten nanometers (7 nm-10 nm).

14. The integrated circuit of claim 13 further comprising a plurality of contact plugs extending through the dielectric layer.

15. The integrated circuit of claim 14 wherein the plurality of contact plugs have a height of about ninety nanometers (90 nm).

16. The integrated circuit of claim 11 wherein the dielectric layer is formed of silicon oxide and the wide metal line is formed of copper.

17. A method of forming a NAND flash memory comprising:
forming a first metal layer over an array of NAND flash memory cells;
forming a first depression and a second depression in an upper surface of the first metal layer;
patterning the first metal layer to form a plurality of first metal lines;
subsequently forming a dielectric layer over the plurality of first metal lines;
subsequently forming a plurality of contact holes through the dielectric layer to expose areas of the first metal layer;
subsequently, filling the plurality of holes with metal to form contact plugs;
subsequently forming a wide trench and a plurality of narrow trenches in the dielectric layer, the wide trench extending deeper in a first outer region and in a second outer region than in a central region located between the first outer region and the second outer region, the first outer region overlying the first depression and the second outer region overlying the second depression;

subsequently depositing a second metal layer that fills the wide trench and the narrow trenches; and subsequently planarizing to leave a plurality of separate bit lines in the plurality of narrow trenches and leaving a wide metal line in the wide trench.

18. The method of claim 17 wherein the first and second depressions are formed by isotropic etching, or anisotropic etching, through an etch mask.

19. The method of claim 18 wherein the first and second depressions are etched to a depth of about seven to ten nanometers (7 nm-10 nm).

20. The method of claim 17 further comprising, subsequent to filling the plurality of holes with metal to form contact plugs, and prior to forming the wide trench and the plurality of narrow trenches in the dielectric layer, planarizing an upper surface of the dielectric layer.

\* \* \* \* \*